US010283872B2

(12) United States Patent
Cohen (10) Patent No.: US 10,283,872 B2
(45) Date of Patent: *May 7, 2019

(54) METHODS AND APPARATUS FOR ENHANCED RADIATION CHARACTERISTICS FROM ANTENNAS AND RELATED COMPONENTS

(71) Applicant: Fractal Antenna Systems, Inc., Bedford, MA (US)

(72) Inventor: Nathan Cohen, Belmont, MA (US)

(73) Assignee: Fractal Antenna Systems, Inc., Bedford, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/019,802

(22) Filed: Jun. 27, 2018

(65) Prior Publication Data

US 2019/0020117 A1 Jan. 17, 2019

Related U.S. Application Data

(63) Continuation-in-part of application No. 15/483,272, filed on Apr. 10, 2017, now Pat. No. 10,014,586, (Continued)

(51) Int. Cl.
*H01Q 15/00* (2006.01)
*H01Q 19/00* (2006.01)
(Continued)

(52) U.S. Cl.
CPC ....... *H01Q 15/0093* (2013.01); *H01L 31/042* (2013.01); *H01Q 1/288* (2013.01);
(Continued)

(58) Field of Classification Search
CPC .................. H01Q 15/0013; H01Q 15/0026
(Continued)

(56) References Cited

U.S. PATENT DOCUMENTS 4,342,036 A 7/1982 Scott et al.
4,814,785 A 3/1989 Wu
(Continued)

OTHER PUBLICATIONS

"Antenna Frequency Scaling" The ARRL Antenna Book, 1988, pp. 2-24 to 2-25.
(Continued)

*Primary Examiner* — Graham P Smith
(74) *Attorney, Agent, or Firm* — Cesari and McKenna, LLP (57) ABSTRACT

Aspect of the present disclosure are directed to methods and apparatus producing enhanced radiation characteristics, e.g., wideband behavior, in or for antennas and related components by providing concentric sleeves, with air or dielectric material as a spacer, where the sleeves include one or more conductive layers, at least a portion of which includes fractal resonators closely spaced, in terms of wavelength. A further aspect of the present disclosure is directed to surfaces that include dual-use or multiple-use apertures. Such aperture engine surfaces can include a first layer of antenna arrays, a second layer including a metal-fractal backplane player, and a third layer including solar cells for solar cell or solar oriented power collection. Fractal metamaterial ribbons with multiple closely-packed fractal resonators are also disclosed.

16 Claims, 7 Drawing Sheets

Related U.S. Application Data which is a continuation of application No. 14/714,844, filed on May 18, 2015, now Pat. No. 9,620,853, which is a continuation of application No. 12/761,283, filed on Apr. 15, 2010, now Pat. No. 9,035,849.

(60) Provisional application No. 62/528,913, filed on Jul. 5, 2017, provisional application No. 62/525,870, filed on Jun. 28, 2017, provisional application No. 61/222,614, filed on Jul. 2, 2009, provisional application No. 61/187,459, filed on Jun. 16, 2009, provisional application No. 61/169,351, filed on Apr. 15, 2009.

(51) Int. Cl.
| | | |
|---|---|---|
| *H01Q 1/28* | (2006.01) | |
| *H01L 31/042* | (2014.01) | |
| *H01Q 1/36* | (2006.01) | |
| *H02S 99/00* | (2014.01) | |
| *H01Q 1/44* | (2006.01) | |

(52) U.S. Cl.
CPC ............ *H01Q 1/36* (2013.01); *H01Q 1/44* (2013.01); *H01Q 15/0013* (2013.01); *H01Q 15/0026* (2013.01); *H01Q 19/00* (2013.01); *H02S 99/00* (2013.01); *Y02E 10/50* (2013.01)

(58) Field of Classification Search
USPC ........................................................ 343/899
See application file for complete search history.

(56) References Cited

U.S. PATENT DOCUMENTS

| | | |
|---|---|---|
| 5,344,729 A | 9/1994 | Akins et al. |
| 5,471,224 A | 11/1995 | Barkeshli |
| 6,104,349 A | 8/2000 | Cohen |
| 6,127,977 A | 10/2000 | Cohen |
| 6,140,975 A | 10/2000 | Cohen |
| 6,445,352 B1 | 9/2002 | Cohen |
| 6,452,553 B1 | 9/2002 | Cohen |
| 6,476,766 B1 | 11/2002 | Cohen |
| 6,985,122 B2 | 1/2006 | Cohen |
| 7,019,695 B2 | 3/2006 | Cohen |
| 7,126,537 B2 | 10/2006 | Cohen |
| 7,145,513 B1 | 12/2006 | Cohen |
| 7,176,838 B1 | 2/2007 | Kinezos |
| 7,190,318 B2 | 3/2007 | Cohen |
| 7,215,290 B2 | 5/2007 | Cohen |
| 7,256,751 B2 | 8/2007 | Cohen |
| 7,345,642 B2 | 3/2008 | Cohen |
| 7,456,799 B1 | 11/2008 | Cohen |
| 2003/0034918 A1 | 2/2003 | Werner et al. |
| 2004/0227682 A1 | 11/2004 | Anderson |
| 2005/0007289 A1 | 1/2005 | Zarro et al. |

OTHER PUBLICATIONS

Fano Bounds for Compact Antennas, Phase 1, JC Allen and J. Meloling, Technical Report 1962, Oct. 2007, SSC San Diego, pp. i to 1.

METHODS AND APPARATUS FOR ENHANCED RADIATION CHARACTERISTICS FROM ANTENNAS AND RELATED COMPONENTS

RELATED APPLICATIONS

This application is a continuation-in-part of U.S. application Ser. No. 15/483,272, filed Apr. 10, 2017 and entitled "Methods and Apparatus for Enhanced Radiation Characteristics From Antennas and Related Components," which is a continuation of U.S. application Ser. No. 14/714,844, filed May 18, 2015 and entitled "Methods and Apparatus for Enhanced Radiation Characteristics From Antennas and Related Components," which is a continuation of U.S. Application Ser. No. 12/761,283, filed Apr. 15, 2010 and entitled "Methods and Apparatus for Enhanced Radiation Characteristics From Antennas and Related Components" now U.S. Pat. No. 9,035,849, which issued on May 19, 2015, which claims priority to (i) U.S. Provisional Patent Application No. 61/169,351, filed Apr. 15, 2009 and entitled "Method and Apparatus for Enhanced Radiation Characteristics from Antennas and Related Components"; (ii) U.S. Provisional Patent Application No. 61/187,459, filed Jun. 16, 2009 and entitled "Satellites and Spacecraft with Aperture Engine Surfaces"; and (iii) U.S. Provisional Patent Application No. 61/222,614, filed Jul. 2, 2009 and entitled "Voice Activated Switching"; this application claims priority to U.S. Provisional Application No. 62/525,870, filed Jun. 28, 2017 and entitled "Aperture Engine Arrays"; this application also claims priority to U.S. Provisional Application No. 62/528,913, filed Jul. 5, 2017 and entitled "Fractal Metamaterial Ribbon"; the entire contents of all of which applications are incorporated herein by reference.

BACKGROUND

Antennas are used to typically radiate and/or receive electromagnetic signals, preferably with antenna gain, directivity, and efficiency. Practical antenna design traditionally involves trade-offs between various parameters, including antenna gain, size, efficiency, and bandwidth.

Antenna design has historically been dominated by Euclidean geometry. In such designs, the closed area of the antenna is directly proportional to the antenna perimeter. For example, if one doubles the length of an Euclidean square (or "quad") antenna, the enclosed area of the antenna quadruples. Classical antenna design has dealt with planes, circles, triangles, squares, ellipses, rectangles, hemispheres, paraboloids, and the like.

With respect to antennas, prior art design philosophy has been to pick a Euclidean geometric construction, e.g., a quad, and to explore its radiation characteristics, especially with emphasis on frequency resonance and power patterns. Unfortunately antenna design has concentrated on the ease of antenna construction, rather than on the underlying electromagnetics, which can cause a reduction in antenna performance.

Practical antenna design traditionally involves trade-offs between various parameters, including antenna gain, size, efficiency, and bandwidth. Antenna size is also traded off during antenna design that typically reduces frequency bandwidth. Being held to particular size constraints, the bandwidth performance for antenna designs such as discone and bicone antennas is sacrificed, resulting in reduced bandwidth.

SUMMARY

Embodiments of the present disclosure can provide techniques, including systems and/or methods, that address problems noted previously.

An aspect of the present disclosure is directed to methods producing enhanced radiation characteristics, e.g., wideband behavior, in or for antennas and related components by providing concentric sleeves, with air or dielectric material as a spacer, where the sleeves include one or more conductive layers, at least a portion of which includes fractal resonators closely spaced, in terms of wavelength.

A further aspect of the present disclosure is directed to systems/apparatus producing enhanced radiation characteristics, e.g., wideband behavior, in or for antennas and related components by providing concentric sleeves, with air or dielectric material as a spacer, where the sleeves include one or more conductive layers, at least a portion of which includes fractal resonators closely spaced, in terms of wavelength.

A further aspect of the present disclosure is directed to surfaces that include dual-use or multiple-use apertures. Such aperture engine surfaces can include a top (or first) layer of antenna arrays, a middle (or second) layer of a metal-fractal backplane player, and a third (or bottom) layer for solar cells or solar oriented power collection.

Of course, one skilled in the art will appreciate that the foregoing or following embodiments and aspects can be combined in any practical combination.

It should be understood that other embodiments according to the present disclosure will become readily apparent to those skilled in the art from the following detailed description, wherein exemplary embodiments are shown and described by way of illustration. The systems and methods of the present disclosure are capable of other and different embodiments, and details of such are capable of modification in various other respects. Accordingly, the drawings and detailed description are to be regarded as illustrative in nature and not as restrictive.

BRIEF DESCRIPTION OF THE DRAWINGS

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

In the following detailed description, numerous specific details are set forth to provide a full understanding of aspects and embodiments of the present disclosure. It will be apparent, however, to one ordinarily skilled in the art that aspects and embodiments of the present disclosure may be practiced without some of these specific details. In other instances, well-known structures and techniques have not been shown in detail to for ease in comprehension.

It is to be understood that both the foregoing summary of the present disclosure and the following detailed description are exemplary and explanatory and are not intended to limit the scope of the present disclosure. Moreover, with regard to terminology used herein, a reference to an element in the singular is not intended to mean "one and only one" unless specifically stated, but rather "one or more." The term "some" refers to one or more. Underlined and/or italicized headings and subheadings are used for convenience only, do not limit the present disclosure, and are not referred to in connection with the interpretation of the description of the present disclosure.

Aspects of the present disclosure are directed to methods and apparatus producing or enhancing radiation characteristics, e.g., wideband behavior, directionality, gain, etc., in antennas and related components by providing concentric sleeves, with air or other dielectric material as a spacer, where the sleeves include one or more conductive layers, at least a portion of which includes fractal resonators closely spaced, in terms of wavelength.

Figure 1:
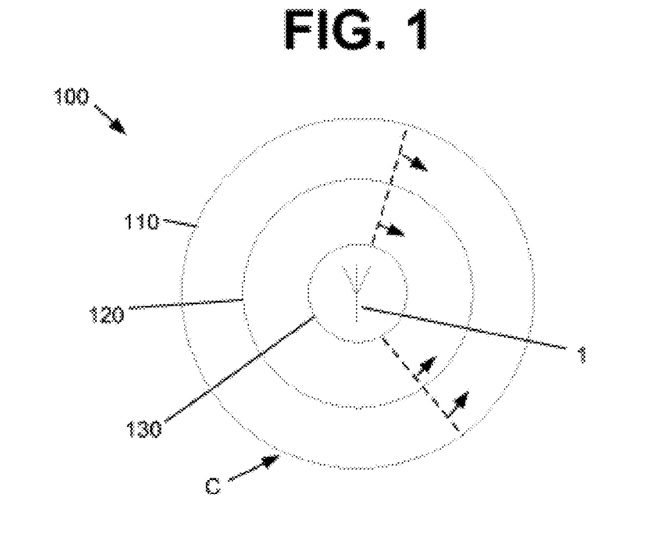
FIG. 1 depicts a diagrammatic end view of a radiation enhancement system utilizing a number of nested sleeves, in accordance with exemplary embodiments of the present disclosure.

FIG. 1 depicts a diagrammatic end view of a radiation enhancement system 100 utilizing a number of nested sleeves, in accordance with exemplary embodiments of the present disclosure. As depicted, system 100 can include a number of nested shells or sleeves, with three (sleeves 110, 120, and 130) being shown. As shown, the sleeves (110, 120, 130) can be configured around a pre-existing antenna 1 to enhances radiation characteristics, e.g., wideband behavior, directionality, gain, etc., of the antenna 1.

Figure 2:
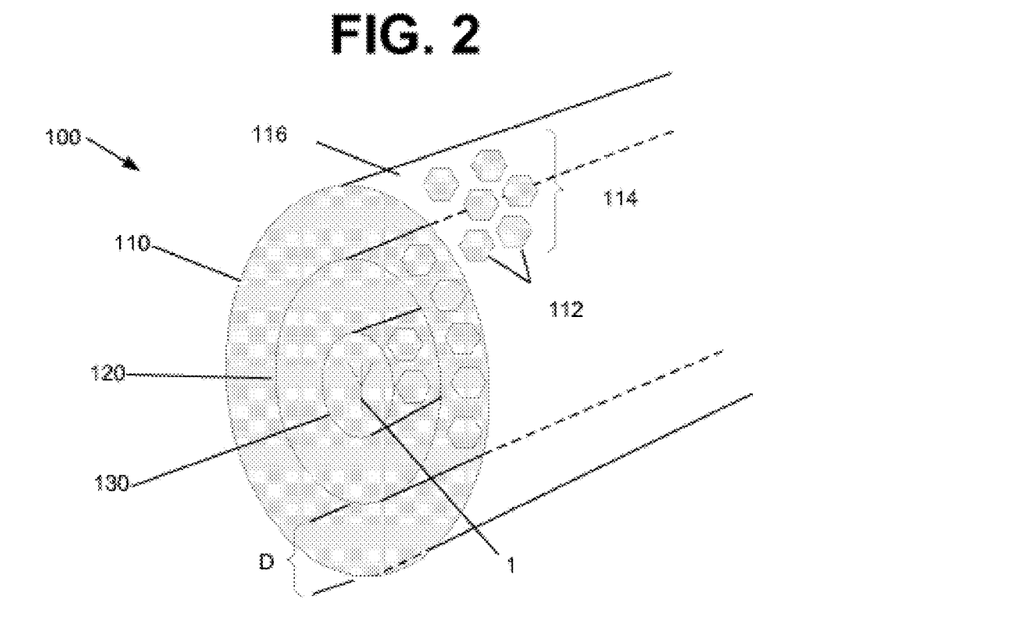
FIG. 2 depicts a perspective view of the system of FIG. 1.

Each of the sleeves (or shells), e.g., sleeve 110, can include one or more layers of dielectric substrates and a conductive portion or portions, e.g., layers or coatings, indicated by "C". Each conductive portion can include a conductive array or resonators or resonant structures (e.g., as shown in FIG. 2). A portion of the resonators or resonant structures can be configured as or include self-similar, or fractal, geometries. The sleeves (110, 120, 130) are not necessarily closed, e.g., about antenna 1, and can be open, as indicted by cutting planes with arrows.

FIG. 2 depicts a perspective view of the system 100 of FIG. 1. As shown, a sleeve (e.g., sleeve 110) can include a number of resonant conductive structures 112 configured in an array 114 on a dielectric substrate 116. Suitable dielectric substrates and materials (e.g., acting as spacers) can include, but are not limited to, polyimide, parylene, polyester, aramid, composite, glass, or similar materials, with suitable adhesives. As noted previously, a portion (or all) of the resonant structures can include resonators having a fractal geometry. The sleeves themselves, e.g., sleeves 110 and 120, can be separated by air or a suitable dielectric material, indicated by D.

With continued reference to both FIGS. 1-2, it should be appreciated that while sleeves 110, 120, and 130 are depicted as being concentric circular cylinders, this configuration of the sleeves is simply for ease in conveying features of the system 100. Other embodiments can actually be open shaped cylinders (i.e., open 2D shapes that extend in an orthogonal direction forming a surface) or nested surfaces that are not cylinders; moreover, the nested structures do not necessarily have to be exactly or substantially concentric.

As indicated previously, each shell or sleeve (e.g., sleeve 110 of FIG. 1) can include multiple resonators. The resonators can be repeated patterns of conductive traces. These conductive traces can be closed geometric shapes, e.g., rings, loops, closed fractals, etc. The resonator(s) can be self similar to at least second iteration. The resonators can include split-ring shapes, for some embodiments. The resonant structures are not required to be closed shapes, however, and open shapes can be used for such. In exemplary embodiments, the resonators are relatively closely packed, e.g., with adjacent separations less than about $\frac{1}{5} \lambda$ (or less) at lowest operational frequency (longest operational wavelength). Other examples of separate distances between adjacent resonators or resonant structures can include any value between $\frac{1}{5} \lambda$ to $\frac{1}{10} \lambda$ inclusive at lowest operational frequency (e.g., which can be in VHF or UHF frequencies).

Figure 3:
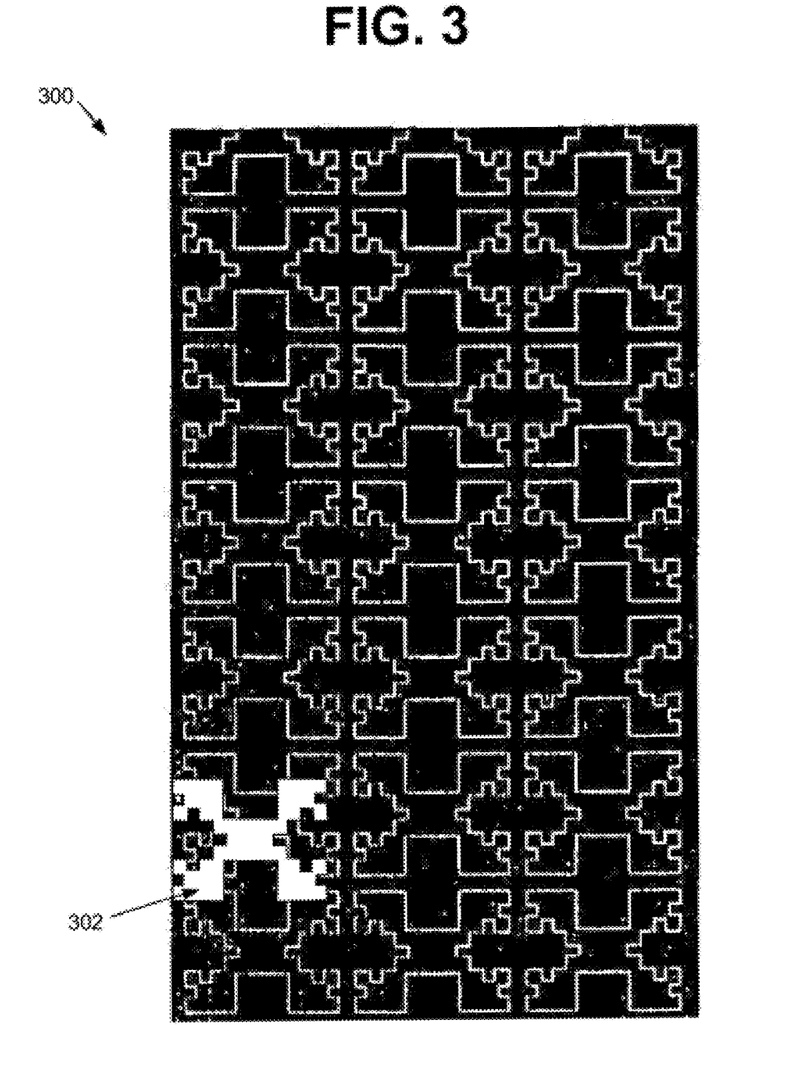
FIG. 3 depicts a portion of a sleeve that includes repeated conductive traces that are configured in a fractal-like shape, in accordance with exemplary embodiments of the present disclosure.

FIG. 3 depicts an exemplary embodiment of a shell or sleeve 300 (only a portion is shown) that includes repeated conductive traces that are configured in a fractal shape 302 (the individual closed traces, as shown by 302, which is offset in the figure for the sake of illustration). For the exemplary embodiment shown, each resonator shape 302 may be, e.g., about 1 cm on a side. The conductive trace is preferably made of copper though any suitable conductive material and/or semi-conductor material can be used. While exemplary fractal shapes are shown in FIG. 3, the present disclosure is not limited to such and any other suitable fractal shapes (including generator motifs) may be used in accordance with the present disclosure. The dimensions and type of fractal shape can be the same for each shell/sleeve type but can vary between shells/sleeves types. This variation (e.g., scaling of the same fractal shape) can afford increased bandwidth for some applications.

Examples of suitable fractal shapes for use in one or more resonators or resonator arrays of the nested sleeves can include, but are not limited to, fractal shapes described in one or more of the following patents, owned by the assignee of the present disclosure, the entire contents of all of which are incorporated herein by reference: U.S. Pat. Nos. 6,452,553; 6,104,349; 6,140,975; 7,145,513; 7,256,751; 6,127,977; 6,476,766; 7,019,695; 7,215,290; 6,445,352; 7,126,537; 7,190,318; 6,985,122; 7,345,642; and, 7,456,799.

Other suitable fractal shape for a resonator or resonant structures can include any of the following: a Koch fractal, a Minkowski fractal, a Cantor fractal, a torn square fractal, a Mandelbrot, a Caley tree fractal, a monkey's swing fractal, a Sierpinski gasket, and a Julia fractal, a contour set fractal, a Sierpinski triangle fractal, a Menger sponge fractal, a dragon curve fractal, a space-filling curve fractal, a Koch curve fractal, a Lypanov fractal, and a Kleinian group fractal.

Figure 4:
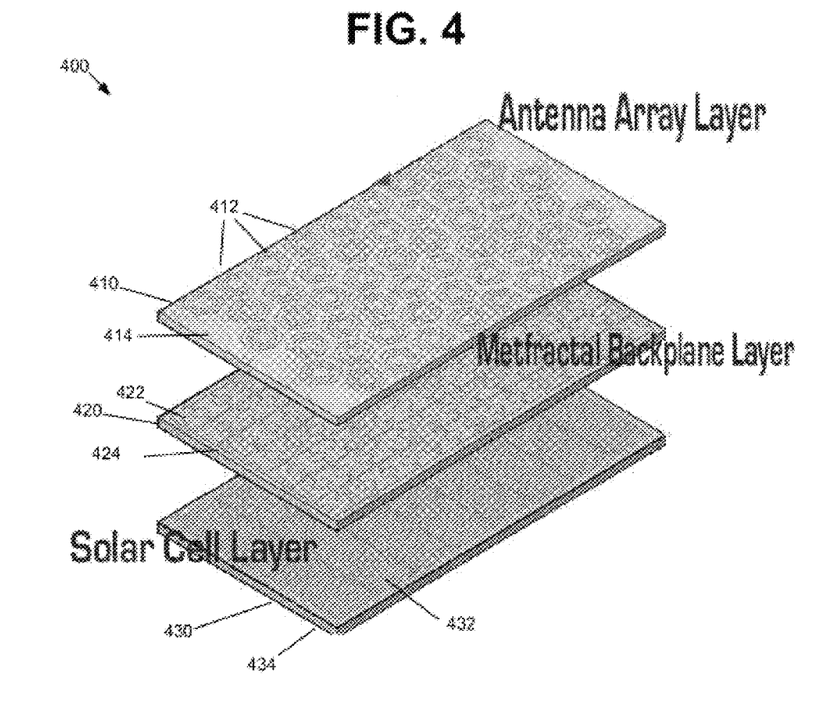
FIG. 4 depicts an exploded view of an aperture engine surface, in accordance with alternate embodiments of the present disclosure.

A further aspect of the present disclosure is directed to surfaces that include dual-use or multiple-use apertures. FIG. 4 depicts an exploded view of an aperture engine surface 400, in accordance with alternate embodiments of the present disclosure. Embodiments of the present disclosure also include one or more of such surfaces, which can be used for desired purposes. As shown in FIG. 4, such a surface 400 can include multiple layers, e.g., a top layer of antenna arrays 410, a middle layer of a metal-fractal backplane player 420, and a layer for solar cell or solar oriented power collection 430 (including solar cells). Since the apertures for such embodiments can provide multiple functions such as collecting power (e.g., from the sun in exemplary embodiments) and then transmit the energy as RF radiation, they can be referred to as "engines" that depend on an "aperture," hence the term "aperture engine."

With continued reference to FIG. 4, the antenna array layer 410 may be composed of or include an array of antennas 412 on a dielectric substrate 414. The antennas 412 can include fractal antennas/resonators, which can afford higher gain for the given size aperture. The fractal antennas 412 can be of a desired shape or include a desired fractal generator (e.g., a Sierpinski triangle or square, Koch, Hilbert, torn-square, Mandelbrot, Minkowski, which can be open or island forms). It should be noted that the elements depicted for the antenna layer in FIG. 4 are representative of individual fractals of desired shape (such as those just listed). The metal-fractal (Metfractal) backplane layer 420 can be treated or considered the same way. In other words, fractal antennas 422 of desired shape (e.g., fractal generator, or motif, and dimensions) on a dielectric substrate 424 can be used. The solar cell layer can include arrays of photovoltaic cells 432 on a suitable substrate 434. Exemplary embodiments of such aperture engine surfaces according to the present disclosure can include or be sued with satellites or spacecraft that can have one or more aperture engine panels. Other embodiments can of course be included within the scope of the present disclosure, e.g., in remote environments having an abundance of sunlight. An exemplary embodiment of an aperture engine surface is shown and described for FIGS. 6A-6B. Moreover, other shapes of panels and/or antennas of the antenna array layer and/or fractal elements of the Metfractal Backplane Layer and/or solar cell layer may be used within the scope of the present disclosure; suitable solar panels, e.g., as commercially available, may be used.

Figure 5:
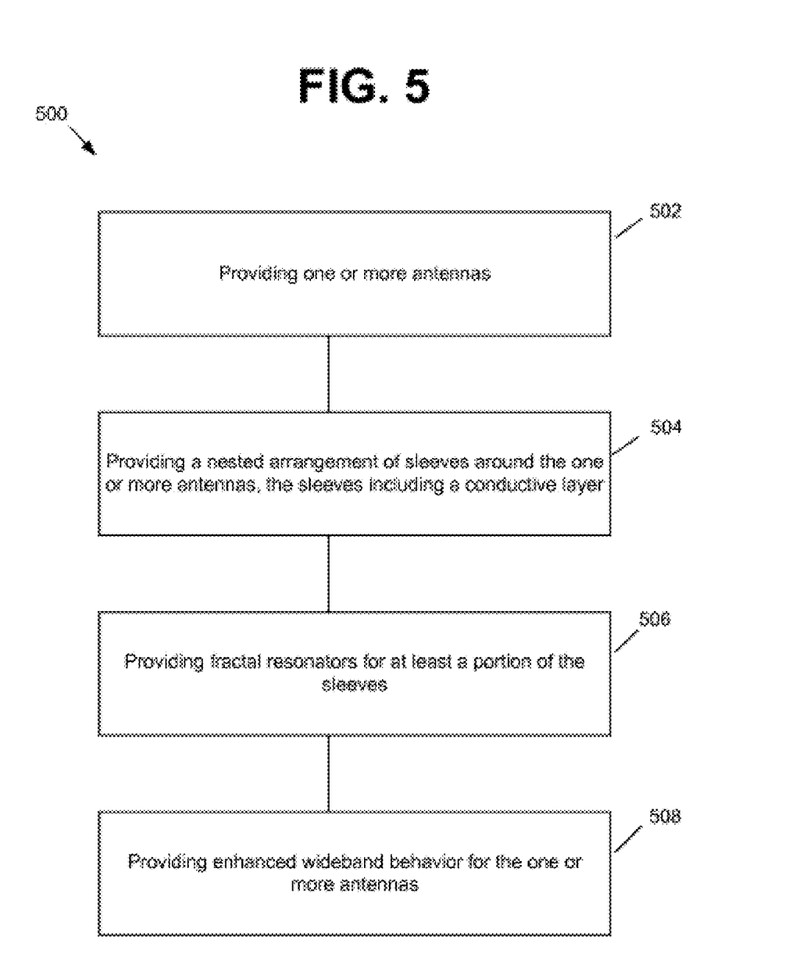
FIG. 5 depicts a box diagram of a method of enhancing antenna radiation characteristics, in accordance with exemplary embodiments of the present disclosure.

FIG. 5 depicts a box diagram of a method 500 of enhancing antenna radiation characteristics, in accordance with exemplary embodiments of the present disclosure. As shown, one or more antennas can be provided, e.g., as described at 502. A nested arrangement of one or more sleeves can be provided, with each sleeve (or, shell) including an conductive layer or portion, e.g., as described at 504. Of course, for the case where a single sleeve or shell is utilized, the term "nested" is not applicable, strictly speaking. It should be noted that for some applications/embodiments, an antenna does not have to be separate from the one or more sleeves, meaning that the one or more sleeves themselves can function as or include one or more antennas.

Continuing with the description of method 500, a portion (or the entirety) of the one or more sleeves can be provided with fractal resonators or resonant structures (e.g., structure 302 of FIG. 3), e.g., as described at 506. Accordingly during operation, radiation characteristics of the antenna(s) can be improved or enhanced, e.g., as described at 508. Such radiation characteristics can include, but are not limited to, increasing the bandwidth, directionality, and/or gain of the antenna(s).

A further aspect of the present disclosure is directed to novel antenna arrays composed of solar-cell collection panels with additional layers, which when the panels are electrically combined, constitute an autonomous or partially autonomous antenna array. Such antenna arrays can be designed for microwave applications, radar applications, and/or applications at other wavelengths, e.g., visible light including ultraviolet and infrared. The panels may include the layers noted previously, with the solar cells acting as a power collection mechanism, and/or an electrical reflector for the antenna or antenna system adjacent to the solar cells. The antenna system may be comprised of a variety of electrically combined transparent elements, or antenna elements, which are preferably highly lacunar: that is, possessing an appreciable number of holes, apertures, or openings (e.g., as a percentage of total area) over a variety of size scales. Example of lacunarity as a percentage of total area can include but are not limited to 30%, 40%, 50%, 60%, 70%, etc.

Figure 6A:
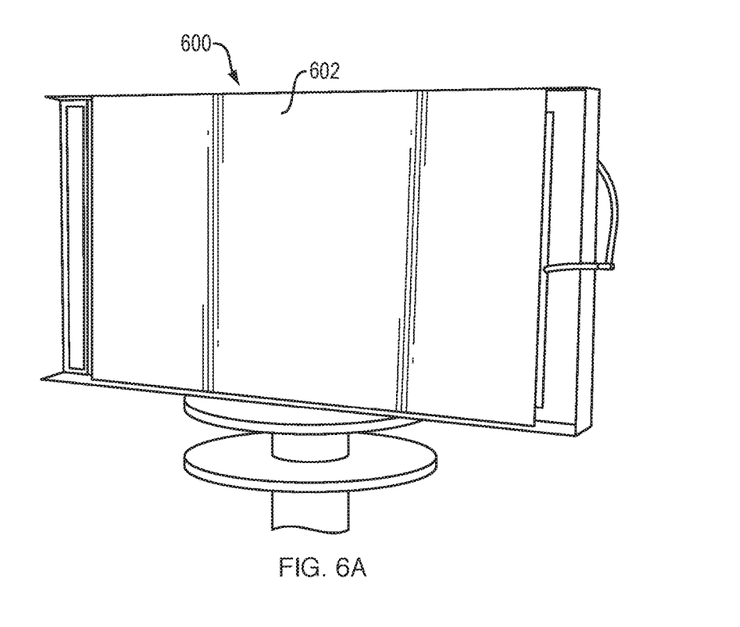
FIGS. 6A and 6B show the front and back of an implemented aperture engine array panel, according to an exemplary embodiment of the present disclosure.
Figure 6B:
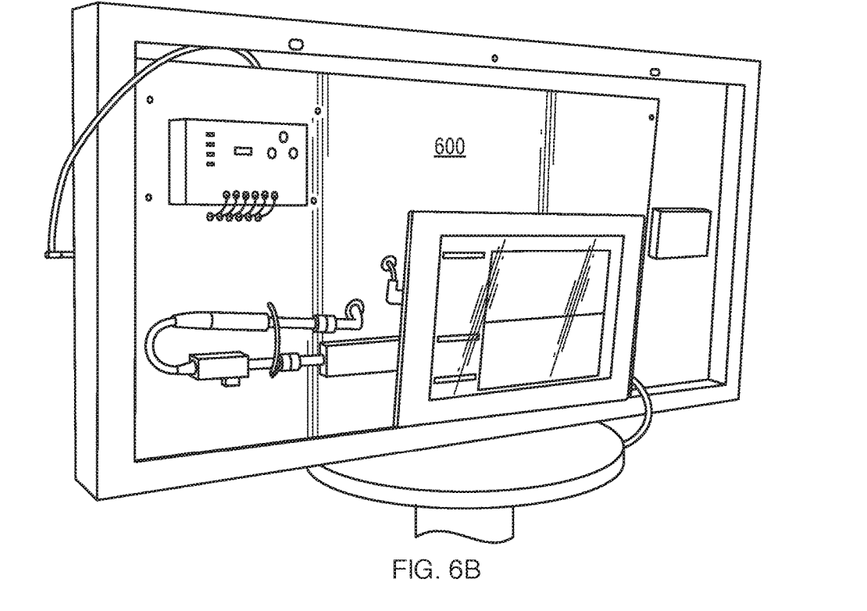
Figure 7:
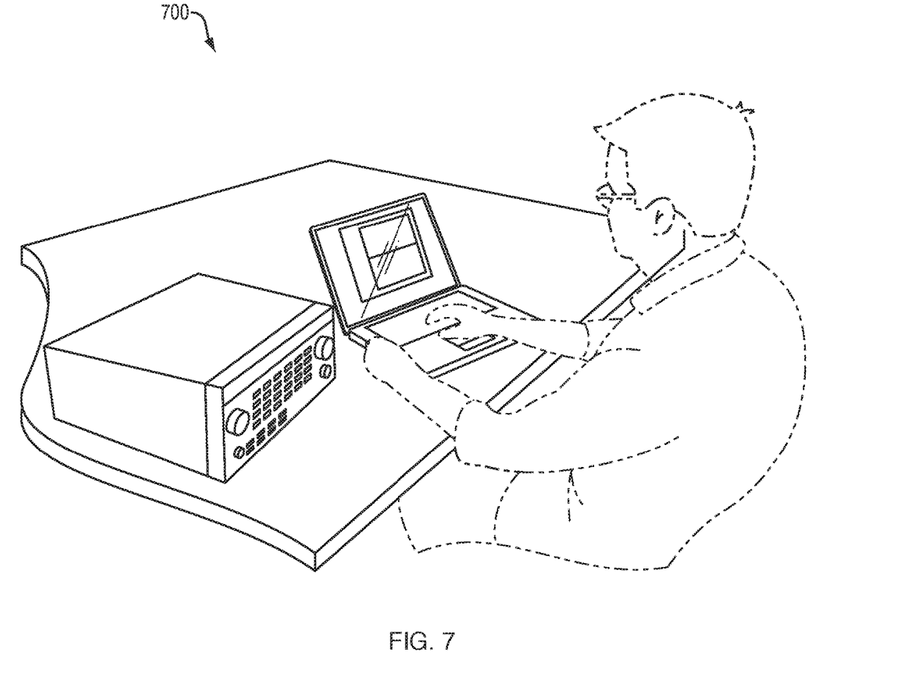
FIG. 7 depicts an example of a wireless transmission-receiver system used with the aperture engine array of FIGS. 6A-6B.

Solar energy passes through the antenna system that is converted to power by the lower layer of solar cells. This power may then be stored and/or used directly to, e.g., run a low noise amplifier, a receiver system, a data acquisition and processing unit, and a wireless transceiver for control and data acquisition (for example, such as shown in FIGS. 6A-6B and 7). These components can be located, e.g., as a lower layer in back of the solar cells and thus the solar cells shield the antenna from the electronics. It will be appreciated that additional electronics or other configurations of layers may be utilized in alternate embodiments.

FIGS. 6A and 6B show the front and back of an implemented aperture engine array panel 600, in this particular embodiment devised with fractal meta-material. As shown in FIG. 6A, panel 600 includes a plurality of resonators 602 configured as a close-packed array 604. The backside of the panel 600 is shown in FIG. 6B, and includes many of the electronic components mentioned above. FIG. 7 depicts an example of a wireless transmission (transceiver) system used with the aperture engine array of FIGS. 6A-6B. Wireless transmission system 700 is shown in FIG. 7, as collected on and controller by a remote computer. The wireless transmission system 700 can include a transmitter/receiver (transceiver) and can be used to communicate with, e.g., control and/or transmit and receive data to and from the aperture engine array panel 600.

It will also be appreciated that such an aperture engine, e.g., aperture engine panel 600, may be used not only for receive functionality (Rx) but for transceiver (Tr/Rx) or transmit only (Tr) functionality by including electronic components that do transmission. Thus such an aperture engine panel is capable and may be embodied as a transmitting system, e.g., a radar system, etc.

An aperture engine panel can be used for and act as a module which may be used separately or within a larger array of such aperture engine panels. Such an array of a plurality of aperture engine panels may be arranged in a variety of fashions (e.g., orientations or directions, which may include multiple orientations or directions such as when disposed on a multifaceted or curved substrate) for optimum reception and/or transmission in a particular direction or directions. It will be appreciated that such an aperture engine array may have its panels controlled individually and separately, e.g., via wireless communication, allowing for a controlled delay line to be invoked on (or, implemented for)

each panel in order to phase up the panels for the array for phased-array operation, to synthesize a large, beam steered aperture. Such as aperture engine array may be designed so as to have a minimum or a total absence of wired cables for power, control, and/or data acquisition. Essentially, for such embodiments, the aperture engine array is physically autonomous, and may be controlled remotely. The aperture engine array poses benefit by providing a higher gain view towards a particular direction, and/or ability to look at several views simultaneously. Thus, such aperture engine arrays may be particularly useful in applications of radio astronomy; particular applications may include, but are not limited to, very-long-baseline interferometry (VLBI), the search for extraterrestrial intelligence (SETI), and space-based ultra-long wavelength (ULW) arrays, to name just a few examples for preferred embodiments of the present disclosure.

An aperture engine array may be ground-based, or conformed to or implemented on or with another object or structure, e.g., on a satellite, structure, vessel, vehicle, or building. It will be appreciated that in other embodiments, an aperture engine array may also be utilized for or on other structures, objects, etc.

Figure 8:
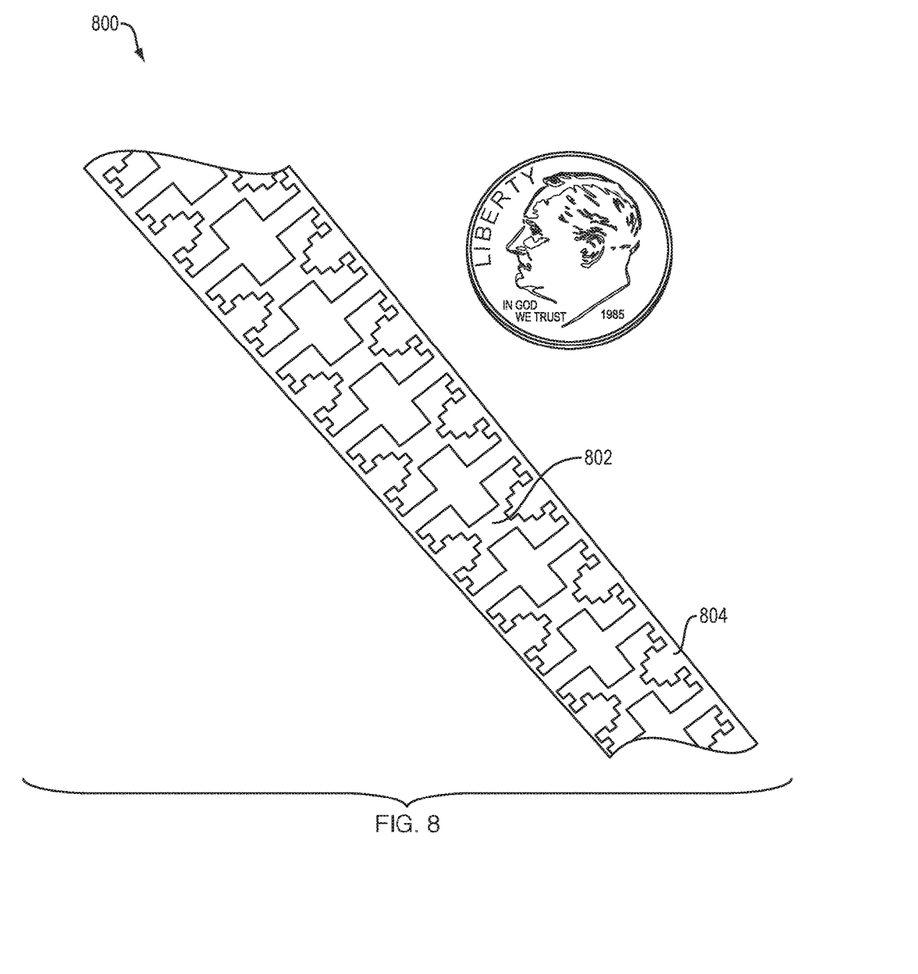
FIG. 8 depicts an example of a fractal metamaterial ribbon according to an exemplary embodiment of the present disclosure.

A further aspect of the present disclosure is directed to and provides a novel electronic component, which may be referred to as a fractal metamaterial ribbon. It can include, and in exemplary embodiments does include, a plurality of closely spaced resonators, each a duplicate (or near duplicate) of the others, and geometrically shaped, at least in part, as a fractal of two or more geometric iterations (e.g., levels or orders of iteration).

FIG. 8 depicts an example of a fractal metamaterial ribbon 800, in accordance with an exemplary embodiment of the present disclosure. As shown, ribbon 800 can include an array of close-packed fractal resonators 802 disposed on a substrate 804. The resonators 802 are closely distributed but do not physically touch one another directly, meaning they are galvanically isolated. The distribution of the resonators is preferably but not necessarily uniform. Substrate 804 can be closed, e.g., configured as a loop, or can be open. Any suitable substrate can be used. Examples include but are not limited to FR4, polyamide, polyimide, Kapton®, suitable plastics, and the like. Example 800 may be implemented for microwave use, and is shown along with a dime for a size comparison.

The resonators in the example shown as 802 in FIG. 8 are closely-spaced electrically, producing and facilitating a strong and efficient surface evanescent-wave transmission along the length of the "ribbon." As shown, there is no direct connection between resonators. The fractal metamaterial ribbon acts as a waveguide (e.g., wire) for electromagnetic transmissions, with the unique characteristic that the resonance and passband of the transmission is not determined by the length of the ribbon, but by the chosen resonator(s) so employed in the plurality.

In an exemplary embodiment, although it will be appreciated that there are many others, a fractal metamaterial ribbon can be used for an antenna, as a groundplane or counterpoise. Because there will be a duplicated current on each resonator, the entire fractal metamaterial ribbon can be employed to radiate, this allowing RF radiation along its entire length of resonators. This may benefit circumstances in which partial obstacles (obstruction) might otherwise impede transmission and/or reception to other locations, as there may be length of the ribbon which is not so shadowed or obstructed. In exemplary embodiments, a fractal metamaterial ribbon may have multiple layers with different sized resonators, thus allowing the possibility of wider overall pass bands. In some application, a fractal metamaterial ribbon can be ohmically (galvanically, or electrically) terminated at one or both ends.

In still yet another embodiment, a fractal material ribbon, e.g., ribbon 800 in FIG. 8, can be used as a multiple radiator across a large range of azimuthal angles, filling in angular gaps, e.g., such as often plague dipoles and other antennas. Exemplary embodiments utilize ribbon 800 in a neckband as an antenna system.

It will be appreciated that the resonant structures of the shells/sleeves according to the present disclosure may be formed or made by any suitable techniques and with any suitable materials. For example, semiconductors with desired doping levels and dopants may be used as conductive materials. Suitable metals or metal containing compounds may be used. Suitable techniques may be used to place conductors on/in a shell, including, but no limited to, printing techniques, photolithography techniques, etching techniques, and the like. Further, related components that can be used with enhanced antenna can include transceivers, transmitters, receivers, baluns, groundplanes, and the like.

It will also be appreciated that the shells may be made of any suitable material(s). Printed circuit board materials may be used. Flexible circuit board materials are preferred. Other material may, however, be used for the shells and the shells themselves can be made of non-continuous elements, e.g., a frame or framework. For example, various plastics may be used.

In exemplary embodiments, representative frequencies of operation can include those at VHF frequencies (e.g., 30-300 MHz) or higher, e.g., over a range of 500 MHz to 1.3 GHz, 3 GHz to 5 GHz, and the like, though others may of course be realized.

While embodiments are shown and described herein as having shells, sleeves, or cylinders in the shape of concentric rings (circular cylinders), such nested shapes can take other shapes in other embodiments. For example, one or more shells can have a generally spherical shape (with possible minor deviations for structural support); one or more shells can have a oblate or prolate spheroid shape; one or more shells can have a parabolic shape, an ellipsoidal shape, and/or a hyperbolic shape; other shapes are of course possible within the scope of the present disclosure. In an exemplary embodiment, the shells could form a nested arrangement of such spherical shapes, around an object to be shielded (at the targeted/selected frequencies/wavelengths). Moreover, the term "cylinder" can include not only reference to circular cylinders but any cylinder formed from a 2D line segment (joined or not) that extends along an axis orthogonal to the 2D line segment. For example, sleeve/shell cross-sections of angular shapes, e.g., triangular, hexagonal, may be used. Moreover, any such shells according to the present disclosure can be shaped to act as lenses and/or waveguides or, in effect, as various optical elements, e.g., diverging or converging prisms and the like.

Exemplary Embodiments

1. An aperture engine array having a plurality of aperture engine panels, wherein each panel comprises: an antenna layer having at least one antenna array, each array configured to receive and/or transmit radio frequency (RF) energy over a range of frequencies, wherein each array comprises fractal resonators configured to allow incident radiation to pass through to an adjacent layer; a backplane layer, at least a portion of which contains a metal surface that acts as a reflective backplane for the at least one antenna array while allowing incident RF radiation pass to an adjacent layer; and a solar cell layer including a panel of solar cells configured to absorb incident radiation and providing power thus provide a power source for the transmission and reception of the RF energy.

2. The aperture engine array of embodiment 1, wherein the aperture engine array comprises a plurality of aperture engine panels configurable in multiple positions for optimum reception and/or transmission in a particular direction or directions.

3. The aperture engine array of embodiment 1, wherein a plurality of panels are configured to comprise a larger surface for greater gathering of incident radiation and greater gain for the function of the antennae.

4. The aperture engine array of embodiment 2, wherein said array is part of a satellite or spacecraft.

5. The aperture engine array of embodiment 3, wherein the array is attached to a satellite or spacecraft.

6. The aperture engine array of embodiment 1, wherein a transmitting apparatus is attached to the aperture array and is powered by the collective power derived from the solar cells of the lowest layers of the aperture engine array panels.

7. The aperture engine array of embodiment 1, wherein a receiving apparatus is attached to the aperture array and is powered by the collected power derived from the solar cells of the lowest layer.

8. The aperture engine array of embodiment 3, wherein the plurality is placed in a remote environment and controlled by remote means.

9. The aperture engine array of embodiment 1, wherein the aperture engine array is utilized for radar transmissions and reception.

10. The aperture engine array of embodiment 3, wherein the aperture engine array is utilized for radar transmissions and reception.

11. The aperture engine array of embodiment 4, whereby the aperture engine array is utilized for radar transmissions and reception.

12. The aperture engine array of embodiment 5, whereby the aperture engine arrays utilized to radar transmissions and reception.

13. The aperture engine array of embodiment 6, wherein the aperture engine arrays utilized for radar transmissions and reception.

14. The aperture engine array of embodiment 6, wherein the aperture engine arrays utilized for transmissions and reception.

15. The aperture engine array of embodiment 8, wherein the aperture engine array is utilized for radar transmission and reception.

16. An aperture engine panel comprising: an antenna layer having at least one antenna array, each array configured to receive and/or transmit radio frequency (RF) energy over a range of frequencies, wherein each array comprises fractal resonators configured to allow incident radiation to pass through to an adjacent layer; a backplane layer, at least a portion of which contains a metal surface that acts as a reflective backplane for the at least one antenna array while allowing incident RF radiation pass to an adjacent layer; and a solar cell layer including a panel of solar cells configured to absorb incident radiation and providing power thus provide a power source for the transmission and reception of the RF energy.

17. A fractal metamaterial ribbon including a plurality of close-packed fractal resonators disposed on a substrate.

The components, steps, features, objects, benefits, and advantages that have been discussed are merely illustrative. None of them, or the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently. For example, in some embodiments, resonators (e.g. 302, 502, and/or 802) can include (in whole or in part) resonators or resonator structures or portions that are not fractal in nature, e.g., split-ring resonators and the like. Thus, resonators according to the present disclosure (fractal and/or non-fractal) can be designed and implemented to produce a desired magnetic susceptibility, e.g., to create strong magnetic coupling to an applied electromagnetic field and/or produce negative permeability.

One skilled in the art will appreciate that embodiments and/or portions of embodiments of the present disclosure can be implemented and/or facilitated in/with computer-readable storage media (e.g., hardware, software, firmware, or any combinations of such), and can be distributed and/or practiced over one or more networks. Steps or operations (or portions of such) as described herein, including processing functions to derive, learn, or calculate formula and/or mathematical models utilized and/or produced by the embodiments of the present disclosure, can be processed by one or more suitable processors, e.g., central processing units ("CPUs) implementing suitable code/instructions in any suitable language (machine dependent on machine independent).

While certain embodiments and/or aspects have been described herein, it will be understood by one skilled in the art that the methods, systems, and apparatus of the present disclosure may be embodied in other specific forms without departing from the spirit thereof.

For example, while certain wavelengths/frequencies of operation have been described, these are merely representative and other wavelength/frequencies may be utilized or achieved within the scope of the present disclosure.

Furthermore, while certain preferred fractal generator shapes have been described others may be used within the scope of the present disclosure. Accordingly, the embodiments described herein are to be considered in all respects as illustrative of the present disclosure and not restrictive.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. An aperture engine array having a plurality of aperture engine panels, wherein each panel comprises:
    an antenna layer having at least one antenna array, each array configured to receive and/or transmit radio frequency (RF) energy over a range of frequencies, wherein each array comprises fractal resonators configured to allow incident radiation to pass through to an adjacent layer;
    a backplane layer, at least a portion of which contains a metal surface that acts as a reflective backplane for the at least one antenna array while allowing incident RF radiation pass to an adjacent layer; and
    a solar cell layer including a panel of solar cells configured to absorb incident radiation and providing power thus provide a power source for the transmission and reception of the RF energy.

2. The aperture engine array of claim 1, wherein the aperture engine array, wherein each of the plurality of aperture engine panels is configurable in multiple positions for optimum reception and/or transmission in a particular direction or directions.

3. The aperture engine array of claim 1, wherein the plurality of aperture engine panels is configured as a surface, larger than an individual panel, for greater gathering of incident radiation and greater antenna gain.

4. The aperture engine array of claim 2, wherein the array is part of a satellite or spacecraft.

5. The aperture engine array of claim 3, wherein the aperture engine array is attached to a satellite or spacecraft.

6. The aperture engine array of claim 1, wherein a transmitting apparatus is attached to the aperture engine array and is powered by power derived from the solar cells of the lowest layers of the aperture engine array panels.

7. The aperture engine array of claim 1, wherein a receiving apparatus is attached to the aperture engine array and is powered by the collected power derived from the solar cells of the lowest layer.

8. The aperture engine array of claim 3, wherein the plurality of aperture engine panels is placed in a remote environment and controlled by remote means.

9. The aperture engine array of claim 1, wherein the aperture engine array is utilized for radar transmissions and reception.

10. The aperture engine array of claim 3, wherein the aperture engine array is utilized for radar transmissions and reception.

11. The aperture engine array of claim 4, wherein the aperture engine array is utilized for radar transmissions and reception.

12. The aperture engine array of claim 5, wherein the aperture engine array is utilized for radar transmissions and reception.

13. The aperture engine array of claim 6, wherein the aperture engine array is utilized for radar transmissions and reception.

14. The aperture engine array of claim 6, wherein the aperture engine array is utilized for transmissions and reception.

15. The aperture engine array of claim 8, wherein the aperture engine array is utilized for radar transmission and reception.

16. An aperture engine panel comprising:
    an antenna layer having at least one antenna array, each array configured to receive and/or transmit radio frequency (RF) energy over a range of frequencies, wherein each array comprises fractal resonators configured to allow incident radiation to pass through to an adjacent layer;
    a backplane layer, at least a portion of which contains a metal surface that acts as a reflective backplane for the at least one antenna array while allowing incident RF radiation pass to an adjacent layer; and
    a solar cell layer including a panel of solar cells configured to absorb incident radiation and providing power thus provide a power source for the transmission and reception of the RF energy.

* * * * *